Sept. 22, 1970 R. V. GOORDMAN 3,530,391

DIFFERENTIAL AMPLIFIER

Filed Aug. 18, 1967 3 Sheets-Sheet 1

INVENTOR
R. V. GOORDMAN
BY
Charles Scott Phelan
ATTORNEY

Sept. 22, 1970 R. V. GOORDMAN 3,530,391

DIFFERENTIAL AMPLIFIER

Filed Aug. 18, 1967 3 Sheets-Sheet 3

United States Patent Office 3,530,391

Patented Sept. 22, 1970

3,530,391

DIFFERENTIAL AMPLIFIER

Robert V. Goordman, Hackettstown, N.J., assignor to Bell Telephone Laboratories, Incorporated, Berkeley Heights, N.J., a corporation of New York Filed Aug. 18, 1967, Ser. No. 661,683

Int. Cl. H03f 3/04, 3/68

U.S. Cl. 330—23 12 Claims

ABSTRACT OF THE DISCLOSURE

A temperature-compensated differential amplifier is developed from a combination of two emitter-coupled differential amplifier stages arranged in a bridge configuration. In various embodiments the stages are coupled together by means of either resistors, diodes, or batteries. Temperature-induced common-mode signals in the stages balance, or offset, one another between the two stages. A feedback loop provides positive and negative feedback to control the operation of the differential amplifier.

BACKGROUND OF THE INVENTION

Field of the invention

The invention is a differential amplifier that is more particularly described as a combination of two differential amplifier stages in a bridge arrangement.

Description of the prior art

Transistorized differential amplifiers are used to amplify direct-current signals with minimum error over a wide temperature range, but ambient temperature changes cause variations of collector-leakage-current $I_{CO}$, base-emitter voltage $V_{BE}$, and current gain $h_{FE}$ of the transistors. In small signal silicon transistor circuits, there is a high rate of change of collector-leakage-current $I_{CO}$ with respect to temperature, but the magnitude of the current $I_{CO}$ at practical bias levels is insignificantly small with respect to base-current $I_B$ and therefore may be neglected in the design of a conventional emitter-coupled differential amplifier. The temperature-induced changes of base-emitter voltage $V_{BE}$ tend to cancel one another in a thermally coupled conventional emitter-coupled differential amplifier. Temperature-induced changes of the current gain $h_{FE}$ cause base-input current $I_B$ to change and effectively produce across a signal source impedance an equivalent potential level shift which is indistinguishable from changes of input signal. By matching the current gain $h_{FE}$ of the transistors in a conventional emitter-coupled differential amplifier, it is possible to make common-mode parasitic changes occur in equal magnitudes without effecting differential-mode signal changes; however, when a single-ended output is desired, there remains an undesirable change of the output potential level caused by the common-mode changes.

Some prior art circuits have arranged diodes in the input circuit or in the output circuit of such a differential amplifier to compensate for fluctuations caused by temperature change, however, the prior art arrangements do not compensate for input signal current changes caused by temperature-induced changes of the current gain $h_{FE}$. Such prior art compensation arrangements are generally restricted to compensating for temperature-induced variations in differential amplifiers driven by signals from sources having a predetermined constant value of internal impedance.

Relative performance of differential amplifiers is determined by a common-mode rejection ratio which is a ratio of difference-mode gain to common-mode gain. Better common-mode rejection ratios have high values which are attained by circuits that suppress common-mode signals more than other differential amplifiers.

SUMMARY OF THE INVENTION

An object of the invention is to improve the common-mode rejection ratio of a differential amplifier.

Another object is to reduce the effects of ambient temperature fluctuations in a differential amplifier.

A further object is to reduce single-ended output potential change caused by ambient temperature variation in a differential amplifier.

These and other objects of the invention are realized in an illustrative embodiment thereof in which two emitter-coupled differential amplifier stages are arranged in a bridge circuit which suppresses internal noise signals induced by ambient temperature and other ambient variations. One stage includes a matched pair of NPN transistors, and the other stage includes a matched pair of PNP transistors. Input terminals of the complementary stages are connected in parallel so that temperature-induced base current changes in the two stages balance, or offset, each other. Output terminals of the stages are electrically coupled through voltage dropping circuits that include intermediate terminals from which balanced differential-mode output signals are produced. The two stages are thermally and electrically intercoupled so that temperature-induced changes of base-emitter voltage and current gain of the transistors are cancelled within the amplifier.

A feature of the invention is a combination of two emitter-coupled differential amplifier stages of opposite conductivity type transistors in a bridge arrangement.

Another feature is a parallel connection of the base electrodes of complementary transistors of the two emitter-coupled differential amplifier stages.

A further feature is a voltage dropping circuit coupling together the outputs of two differential amplifiers in a bridge arrangement.

A still further feature is a feedback loop coupling output signals back to control the operation of a differential bridge amplifier.

BRIEF DESCRIPTION OF THE DRAWINGS

A better understanding of the invention may be derived from the detailed description following if that description is considered with respect to the attached drawings in which.

DETAILED DESCRIPTION

Figure 1:
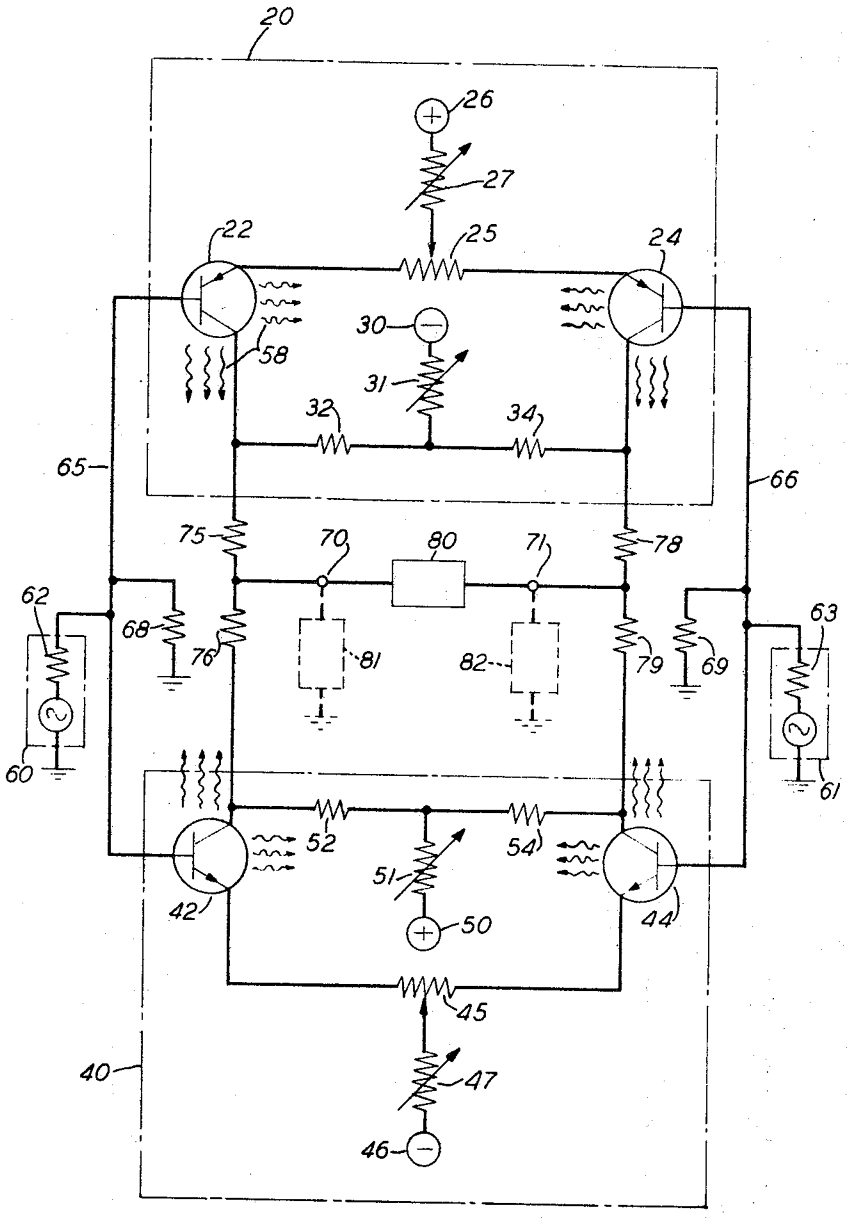
FIG. 1 is a schematic diagram of a differential bridge amplifier in accordance with the invention.

Referring now to FIG. 1, there are shown two emitter-coupled differential amplifier stages 20 and 40 arranged as a differential bridge amplifier.

The stage 20 is a conventional emitter-coupled differential amplifier including a matched pair of PNP transistors 22 and 24 having their emitter electrodes coupled together through a voltage balancing resistor 25. A current source, including a grounded positive-potential source 26 and an adjustable resistor 27, is coupled to the balancing resistor 25 center tap which is a common junction in the emitter circuits of the transistors 22 and 24. Collector supply potential is provided from a grounded negative-potential source 30 by way of an adjustable resistor 31 and resistors 32 and 34 to respective collector electrodes of the transistors 22 and 24.

The stage 40 is also a conventional emitter-coupled differential amplifier, but it includes a matched pair of NPN transistors 42 and 44 having their emitter electrodes coupled together through a voltage balancing resistor 45. A current source, including a grounded negative-potential source 46 and an adjustable resistor 47, is coupled to the balancing resistor 45 center tap which is a common junction in the emitter circuits of the transistors 42 and 44. Collector supply potential for the transistors 42 and 44 is provided from a grounded positive-potential source 50 by way of an adjustable resistor 51 and resistors 52 and 54 to the respective collector electrodes of the transistors 42 and 44.

The transistors 22, 24, 42, and 44 are selected to have parameters which are essentially matched and are arranged so that they are coupled together thermally. Thermal coupling may be accomplished in any known manner such as mounting all of the transistors on the same surface which is a direct-current electrical insulator and a good thermal conductor. Examples of such surfaces are those comprised of either beryllium oxide or aluminum oxide. Thermal coupling of the transistors is shown schematically in FIG. 1 as sets of wavy arrows 58 pointing from one transistor to another.

Input signals from grounded signal sources 60 and 61 are applied through source impedances 62 and 63 to base electrodes of the transistors in the differential amplifiers. As shown in FIG. 1, a lead 65 connects a base electrode of the transistor 22 to a base electrode of the transistor 42, and a lead 66 connects a base electrode of the transistor 24 to a base electrode of the transistor 44. The signal sources 60 and 61 are to be connected to the respective leads 65 and 66 for balanced input operation. Alternatively, the signal source 60 alone or the signal source 61 may be connected to the respective leads 65 or 66 for single-ended input operation. A resistor 68 couples the lead 65 to ground when the signal source 60 is connected to the lead 65, and a resistor 69 couples the lead 66 to ground when the signal source 61 is connected to the lead 66. If either signal source 60 or 61 is omitted for single-ended input operation, the associated resistor should be shorted to ground.

A coupling circuit in a bridge arrangement is interposed between the collector circuits of the stages 20 and 40. In the coupling circuit there is a first direct-current voltage dropping path, or voltage divider including resistors 75 and 76, interposed in series circuit between the collector electrodes of the transistors 22 and 42. There is a second direct-current voltage dropping path, or voltage divider including resistors 78 and 79, interposed in series circuit between the collector electrodes of the transistors 24 and 44. It is noted that the collector electrodes of transistors 22 and 24 and of transistors 42 and 44 are output terminals respectively for the stages 20 and 40.

Output signals of the differential bridge amplifier are produced at output terminals 70 and 71 in the coupling circuit. The output terminals 70 and 71 are respectively connected to intermediate terminals of the first and second voltage dropping paths which couple the collector circuits together.

The differential bridge amplifier can be operated in accordance with the following arrangements known in the prior art: balanced-input to balanced-output, balanced-input, to single-ended output, single-ended input to balanced-output, or single-ended input to single-ended output. The bridge amplifier operates with a high common-mode rejection ratio for relatively large ambient temperature variations and relatively large changes of input source impedance in the above-mentioned arrangements.

It can be shown analytically that the differential bridge amplifier has an improved common-mode rejection ratio against temperature induced variations or a better signal to thermal error ratio than conventional emitter-coupled differential amplifiers in each of the previously listed operating arrangements. As previously mentioned, temperature variations cause substantial changes in the base-emitter voltage $V_{BE}$ and the current gain $h_{FE}$ of transistors such as the transistors 22, 24, 42, and 44, but the effects of the temperature variations are substantially suppressed in the differential bridge amplifier.

Temperature-responsive base-emitter voltage $V_{BE}$ variations cancel between the base-emitter junctions within each of the stages 20 and 40 in a manner similar to that in which they cancel in a conventional emitter-coupled differential amplifier. Temperature-responsive base-emitter voltage $V_{BE}$ variations additionally cancel between the stages 20 and 40 because the transistor 22 is matched with and is thermally coupled to the transistor 42 and the transistor 24 is matched with and is thermally coupled to the transistor 44.

Temperature-responsive current gain $h_{FE}$ variations also cancel between the stages 20 and 40, and the effects of such variations are not reflected back to the signal sources 60 and 61. As the current gain $h_{FE}$ varies, the base-current $I_B$ of the transistors 22, 24, 42, and 44 increase or decrease by similar magnitudes because the four transistors have matched parameters and they are thermally coupled. The temperature-responsive change of base current to the transistor 22 is equal to but oppositely poled from the temperature-responsive change of base current to the transistor 42 because the two transistors are matched and are of opposite conductivity types. The temperature responsive change of base current to the transistor 24 is equal to but oppositely poled from the temperature-responsive change of base current to the transistor 44 also because they are matched transistors of opposite conductivity types. Since the base electrodes of the transistors 22 and 42 are connected together by the lead 65 and the base electrodes of the transistors 24 and 44 are connected together by the lead 66, the base-current changes balance, or cancel, between the amplifiers 20 and 40. Therefore, essentially no temperature-induced changes of the base current are reflected back to the sources 60 and 61 because the changes merely occur in the leads 65 and 66 where the changes balance, or offset, one another.

Since the temperature-induced changes of base current are cancelled between the stages 20 and 40 and no such changes are reflected back to the sources 60 and 61, those sources can have any internal impedance value without resulting in temperature-induced common-mode signals. The temperature-induced changes of base current are not reflected back to the source impedances 62 and 63 as in the conventional emitter-coupled differential amplifier in which the magnitude of the source impedance and the magnitude of the change of base current determine the voltage magnitude of error signals induced by temperature variations.

When the differential bridge amplifier is operated balanced-input to balanced-output, the sources 60 and 61 are connected respectively to the leads 65 and 66 and a load 80 is connected between the output terminals 70 and 71. When so balanced, neither the terminal 70 nor the terminal 71 is coupled through a load to ground reference. Differential-mode input signals from the sources 60 and 61 produce differential-mode output signals across the load 80, and the potentials on the terminals 70 and 71 are of opposite polarity with respect to ground reference. The magnitude of differential-mode output signals is essentially twice the magnitude of differential-mode signals produced at the output of a single prior art emitter-coupled differential amplifier because the stages 20 and 40 are effectively operating in parallel relative to differential-mode input signals. As previously mentioned, temperature-induced common-mode signals produced within the stages 20 and 40 offset one another within the bridge amplifier, and essentially no resultant input current changes are reflected back to the sources 60 and 61. Thus the common-mode rejection ratio is improved by the parallel effect with respect to differential-mode signals and by the cancellation of temperature-responsive internally-generated common-mode signals.

The common-mode rejection ratio, C.M.R., is the ratio of the difference-mode gain to the common-mode gain.

$$\text{Difference-mode gain } A_d = \Delta v_o / \Delta v_d$$
$$\text{Common-mode gain } A_c = \Delta v_o / \Delta v_c$$

Difference-mode gain $A_d$ is determined by measuring the differential-mode component of output signal $\Delta v_o$ between the terminal 70 and ground when an incremental differential-mode input signal $\Delta v_d$ from the sources 60 and 61 is applied between the leads 65 and 66 and thereafter evaluating the relevant ratio. Common-mode gain $A_c$ is determined by measuring the common-mode component of output signal $\Delta v_o$ between the terminal 70 and ground when an incremental common-mode input signal $\Delta v_c$ from the sources 60 and 61 is applied between ground and each of the leads 65 and 66 and then evaluating the relevant ratio.

When the differential bridge amplifier is operated single-ended input to balanced-output, only one of the signal sources, such as source 60 is connected to the bridge amplifier and the load 80 is connected between the terminals 70 and 71. The lead 66 is shorted to ground. Operation is essentially the same as in the balanced-input to balanced-output arrangement except that input signals are of only one polarity with respect to ground at any instant.

When the differential bridge amplifier is operated balanced-input to single-ended output, the sources 60 and 61 are connected respectively to the leads 65 and 66 and a load 81 is connected between the terminal 70 and ground reference. A load 82 may be connected between the terminal 71 and ground reference in addition to the load 81 or as an alternative to the load 81. The load 80 used in the balanced output arrangement is omitted for single-ended output operation.

In these balanced-input to single-ended output arrangements, temperature-induced common-mode signals produced within the stages 20 and 40 balance, or offset, one another within the bridge amplifier; and essentially no resultant input current changes are reflected back to the sources 60 and 61. Little or no potential change occurs across either the load 81 or the load 82 as a result of ambient temperature changes. Thus temperature-induced common-mode output signals are reduced by offsetting temperature-induced components of common-mode output signals produced in the stage 20 with similar but oppositely poled signals produced in the stage 40. The ratio of signal to thermal error signal is therefore advantageously increased in value because the thermal error signal is reduced.

When the differential bridge amplifier is operated single-ended input to single-ended output, only one of the signal sources, such as source 60, is connected to the bridge amplifier; and the lead 66 is grounded. The load 81 is connected between the output terminal 70 and ground reference. The loads 80 and 82 are omitted.

In this single-ended input to single-ended output arrangement, temperature-induced common-mode signals produced within the stages 20 and 40 offset one another within the bridge amplifier. Essentially no resultant input current changes are reflected back to the source 60. Little or no potential change occurs across the load 81 as a result of ambient temperature changes. Thus temperature-induced common-mode output signals are reduced by offsetting temperature-induced components of common-mode output signals produced in the stage 20 with similar but oppositely poled signals produced in the stage 40. The ratio of signal to thermal error signal is therefore advantageously increased in value because the thermal noise is reduced.

Figure 2:
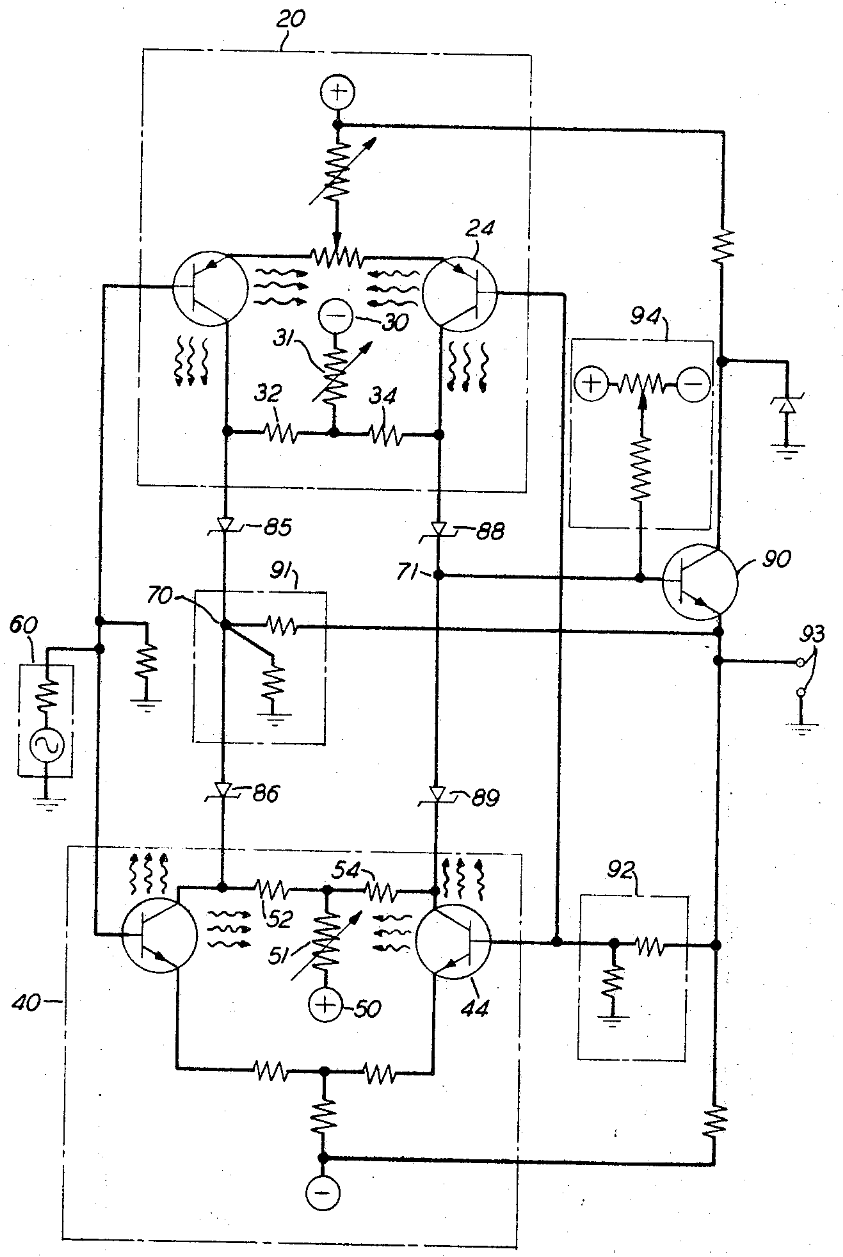
FIG. 2 is a schematic diagram of another embodiment of the differential bridge amplifier in accordance with the invention.

Referring now to FIG. 2, there is shown a differential bridge amplifier similar to the bridge amplifier shown in FIG. 1 except for reverse breakdown diodes 85, 86, 88, and 89 which respectively replace resistors 75, 76, 78, and 79 in the coupling circuit. The signal source 60 is shown connected for single-ended input operation, and a feedback arrangement, to be described, has been added.

Although the signal source 61 is omitted from FIG. 2 to show the feedback arrangement, the source 61 can be used in the circuit of FIG. 2 if the feedback arrangement is omitted. Without the feedback arrangement, the bridge amplifier of FIG. 2 operates similar to the bridge amplifier of FIG. 1 except that the voltage dropping paths in the coupling circuit include the diodes 85, 86, 88, and 89 rather than resistors.

The sources 30 and 50 and the resistors 31, 32, 34, 51, 52, and 54 are selected so that the diodes 85, 86, 88, and 89 are biased to be continuously conducting in their reverse conduction modes. Quiescent current conducted by the diodes is supplies from the sources 30 and 50 as an addition to quiescent current supplied to the transistor collector electrodes. The quiescent current supplied each of the diodes 85, 86, 88, and 89 should be equal to or greater than the quiescent current supplied to each collector electrode. The reverse breakdown diodes are selected to have essentially equal reverse breakdown voltages that are of sufficient magnitude to maintain linear operation. Although these diodes generally require more quiescent current than the resistors of FIG. 1, the continuously conducting diodes insert a small impedance into the circuit than resistors do for the same current and therefore have a shorter time constant for improving high frequency response.

Positive and negative feedback signals are produced by the feedback arrangement in a manner known in the prior art and are applied to the differential bridge amplifier to increase input impedance, to lower output impedance, and to increase power gain, An NPN transistor 90 in the feedback loop is arranged as an emitter-follower amplifier. The output terminal 71 of the differential bridge amplifier is connected to a base electrode of the transistor 90 to apply output signals of the bridge amplifier to the base electrode for driving the transistor 90. A base bias circuit 94 establishes on the base electrode of transistor 90 an offset voltage with respect to ground and equal in magnitude to the base-emitter voltage of the transistor 90 so that the emitter electrode of the transistor 90 is held at ground potential when the input signal is at ground potential. Positive feedback signals are coupled from the emitter-follower to the bridge amplifier through a voltage divider 91 which is interposed between an emitter electrode of the transistor 90 and the output terminal 70. Negative feedback signals are coupled from the emitter-follower to the bridge amplifier through a voltage divider 92 which is interposed between the emitter electrode of the transistor 90 and the base electrodes of the transistors 24 and 44. Ratios of the voltage dividers 91 and 92 are determined in accordance with methods known in the prior art. Output signals from the bridge amplifier arranged with feedback are produced between the emitter electrode of the transistor 90 and ground reference. Terminals 93 are shown to indicate where a load should be connected for achieving the increased power gain and the impedance changes previously mentioned.

The feedback arrangement shown in FIG. 2 may be advantageously inserted into the circuit shown in FIG. 1, but it has been omitted from FIG. 1 to clarify operation of the differential bridge amplifier.

Figure 3:
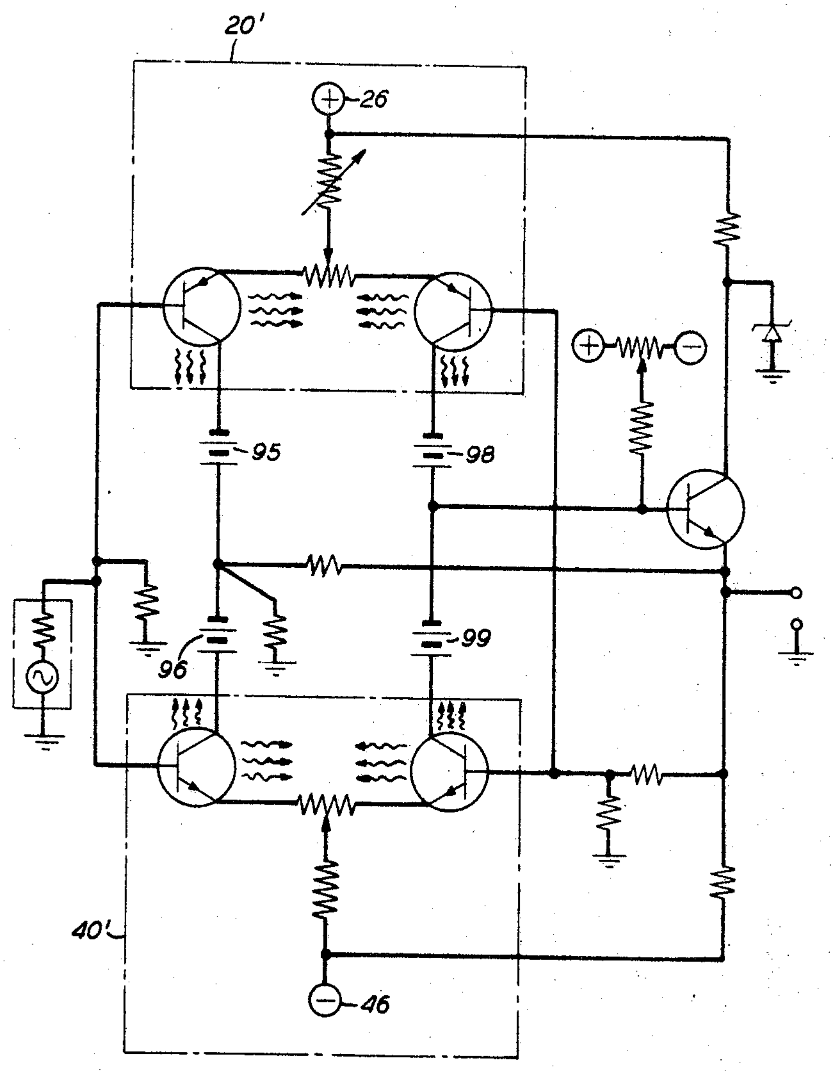
FIG. 3 is a schematic diagram of a further embodiment of the differential bridge amplifier in accordance with the invention.

Referring now to FIG. 3, there is shown a differential bridge amplifier similar to the bridge amplifier shown in FIG. 2 except that batteries 95, 96, 98, and 99 replace respectively the reverse breakdown diodes 85, 86, 88, and 89 in the coupling circuit. Since the batteries are included in the coupling circuit, the differential amplifier stages 20' and 40' are somewhat modified from the stages 20 and 40, shown in FIG. 2. The sources 30 and 50 and the resistors 31, 32, 34, 51, 52, and 54 shown in FIG. 2 have been eliminated. Quiescent currents for the stages 20' and 40' are determined by the resistance in the respective emitter circuits and the potentials of the sources 26 and 46 and of the batteries 95, 96, 98, and 99. The batteries continuously conduct the quiescent current of the transistors and are selected to have essentially equal voltage drop which is of sufficient magnitude to maintain linear operation of the stages 20' and 40'.

The differential bridge amplifier shown in FIG. 3 operates essentially in the same manner as the differential bridge amplifier, shown in FIG. 2 and described previously, except that the voltage dropping paths in the coupling circuit include the batteries rather than diodes. The batteries 95, 96, 98, and 99 conduct less current than the sources 30 and 50 of FIG. 2 because the batteries are arranged in series circuit in the coupling path rather than being arranged to supply current to the parallel branches of a transistor collector and a reverse breakdown diode, as required in the arrangement of FIG. 2.

The above-detailed description is illustrative of several embodiments of the invention, and it is to be understood that additional embodiments thereof will be obvious to those skilled in the art. The embodiments described herein together with those additional embodiments are considered to be within the scope of the invention.

What is claimed is:

1. An amplifier comprising:

a first differential amplifier including first and second input terminals, first and second output terminals, and first and second semiconductor devices of a first conductivity type, the first and second devices each having base, collector, and emitter electrodes, said base electrodes respectively connected to the first and second input terminals, said collector electrodes respectively connected to the first and second output terminals, said emitter electrodes connected to a first substantially constant current source, a second differential amplifier including third and fourth input terminals, third and fourth output terminals, and third and fourth semiconductor devices of a second conductivity type, the third and fourth devices each having base, collector, and emitter electrodes, said base electrodes respectively connected to the third and fourth input terminals, said collector electrodes respectively connected to the third and fourth output terminals, said emitter electrodes connected to a second substantially constant current source, means connecting the first input terminal to the third input terminal for balancing temperature-responsive changes of base current in the first device with temperature-responsive changes of base current in the third device, means connecting the second input terminal to the fourth input terminal for balancing temperature-responsive changes of base current in the second device with temperature-responsive changes of base current in the fourth device, a first voltage dropping means coupling the first output terminal to the third output terminal, and a second voltage dropping means coupling the second output terminal to the fourth output terminal.

2. An amplifier in accordance with claim 1 further comprising:

means thermally coupling the semiconductor devices of the first and second differential amplifiers, the semiconductor devices having substantially matched current gains, the first, second, third, and fourth devices being subject to temperature variations causing device base current requirements to increase and decrease together with one another in substantially equal magnitude changes.

3. An amplifier in accordance with claim 1 further comprising:

a first signal source interposed between a ground reference and the first and third input terminals.

4. An amplifier in accordance with claim 3 further comprising:

load means coupling an intermediate terminal in the first voltage dropping means to ground reference for conducting current components respectively including opposite polarity temperature-responsive variations from the first and third devices.

5. An amplifier in accordance with claim 3 further comprising:

a load coupling an intermediate terminal in the second voltage dropping means to ground reference.

6. An amplifier in accordance with claim 3 further comprising:

a load coupling an intermediate terminal in the first voltage dropping means to an intermediate terminal in the second voltage dropping means.

7. An amplifier in accordance with claim 3 further comprising:

a second signal source interposed between ground reference and the second and fourth input terminals, the first and second devices each has a collector electrode respectively connected to the first and second output terminals, the third and fourth devices each has a collector electrode respectively connected to the third and fourth output terminals, and means mounting the first, second, third, and fourth semiconductor devices on a thermal conductor, the semiconductor devices each having substantially matched parameters, $h_{FE}$, wherein $h_{FE}$ is current gain.

8. An amplifier in accordance with claim 1 in which the first and second voltage dropping means each includes a plurality of resistors in series circuit.

9. An amplifier in accordance with claim 1 in which the first and second voltaged ropping means each includes a plurality of diodes in series circuit.

10. An amplifier in accordance with claim 1 in which the first and second voltage dropping means each includes a plurality of batteries in series circuit, the first and second devices each has a collector electrode respectively connected to the first and second output terminals, the third and fourth devices each has a collector electrode respectively connected to the third and fourth output terminals, the first voltage dropping means balance temperature-responsive changes of base-emitter voltage in the first and third devices, the second voltage dropping means balance temperature-responsive changes of base-emitter voltage in the second and fourth devices, a signal source is interposed between a ground reference and the first and third input terminals, and a load couples an intermediate terminal in the first voltage dropping means to the ground reference.

11. An amplifier in accordance with claim 1 in which feedback means couple positive feedback signals to the first voltage dropping means and negative feedback signals to the second and fourth input terminals.

12. An amplifier comprising first and second transistors of a first conductivity type including base, emitter, and collector electrodes, third and fourth transistors of a second conductivity type including base, emitter, and collector electrodes, a substantially constant current source of a first polarity coupled in common to the emitter electrodes of the first and second transistors, a substantially constant current source of a second polarity coupled in common to the emitter electrodes of the third and fourth transistors, first and second direct-current voltage dropping circuits, means coupling in a closed direct-current circuit loop a collector junction of the first transistor, the first voltage dropping circuit, and a collector junction of the third transistor, and means coupling in a closed direct-current circuit loop a collector junction of the second transistor, the second voltage dropping circuit, and a collector junction of the fourth transistor.

References Cited

UNITED STATES PATENTS

| | | | |
|---|---|---|---|
| 2,260,170 | 10/1941 | Curl | 330—124 X |
| 3,259,758 | 7/1966 | Hobrough | 330—69 X |
| 3,262,064 | 7/1966 | Hilbiber | 330—23 |
| 3,373,367 | 3/1968 | Clarke | 330—124 X |
| 3,258,704 | 6/1966 | Wittman | 330—30 X |

NATHAN KAUFMAN, Primary Examiner

U.S. Cl. X.R.

330—30, 69